Aug. 3, 1965 L. K. BAKER ETAL 3,198,999

NON-INJECTING, OHMIC CONTACT FOR SEMICONDUCTIVE DEVICES

Filed March 18, 1960 3 Sheets-Sheet 1

INVENTORS
L. K. BAKER
T. E. MAGILL
By S. Gundersen
ATTORNEY

Aug. 3, 1965 L. K. BAKER ETAL 3,198,999

NON-INJECTING, OHMIC CONTACT FOR SEMICONDUCTIVE DEVICES

Filed March 18, 1960 3 Sheets-Sheet 2

INVENTORS
L. K. BAKER
T. E. MAGILL
By S. Gundersen
ATTORNEY

NON-INJECTING, OHMIC CONTACT FOR SEMICONDUCTIVE DEVICES

Filed March 18, 1960 3 Sheets-Sheet 3

INVENTORS
L. K. BAKER
T. E. MAGILL
BY [signature]
ATTORNEY

United States Patent Office 3,198,999
Patented Aug. 3, 1965

3,198,999
NON-INJECTING, OHMIC CONTACT FOR SEMICONDUCTIVE DEVICES

Lawrence K. Baker, Reading, and Thomas E. Magill, Allentown, Pa., assignors to Western Electric Company, Incorporated, New York, N.Y., a corporation of New York Filed Mar. 18, 1960, Ser. No. 16,002
4 Claims. (Cl. 317—234)

Figure 1:
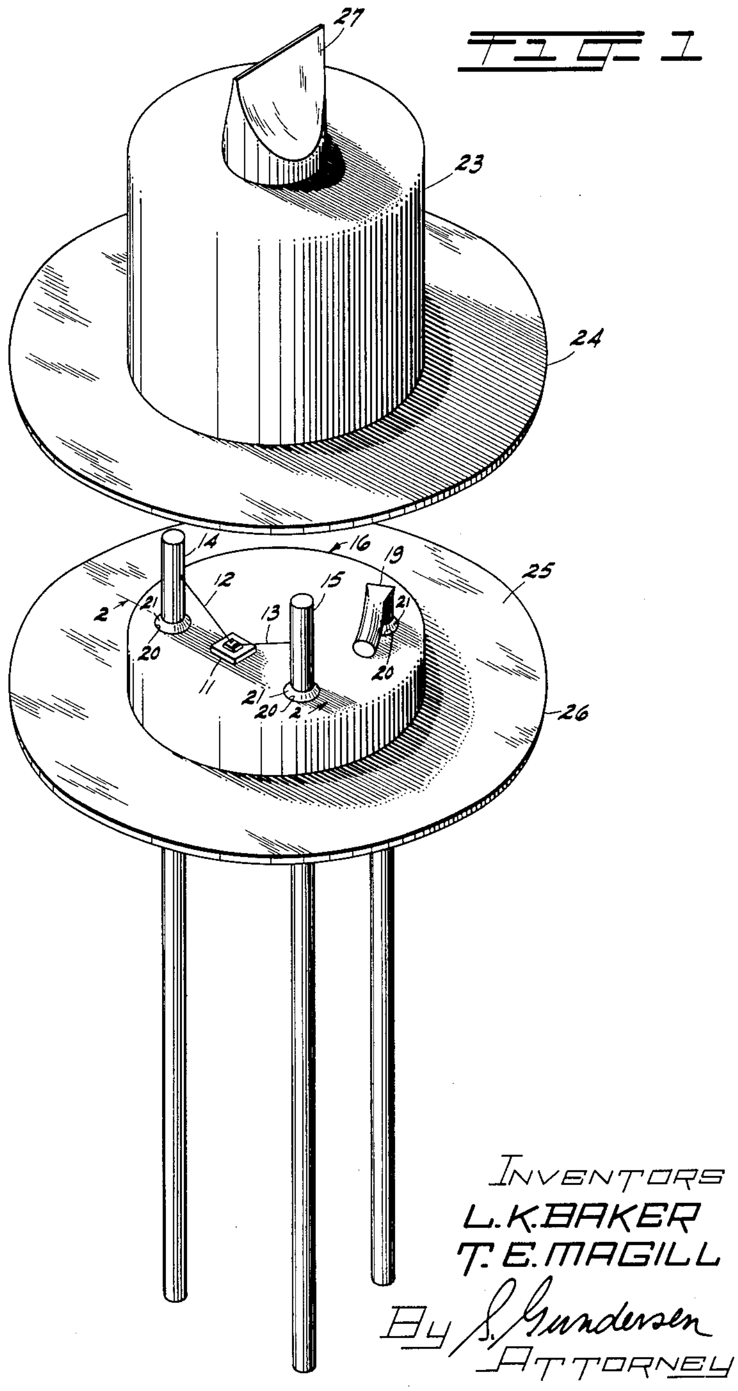

This invention relates to the fabrication of signal translating devices and particularly to the fabrication of semiconductive devices having ohmic connections.

A significant characteristic of devices using semiconductive material is the injection of carriers from connections into the body. In many applications this characteristic is used advantageously to accomplish the purposes to which the device is applied. However, in other applications carrier injection at the contact produces deleterious effects which interfere with the performance of the device. One manifestation of this undesired effect is found, for example, in diffused base germanium transistors with a PNP configuration. In these transistors injection of minority carriers at the contact to the collector region materially affects the stability of the device. Frequently, a large percentage of units with an alpha or current amplification factor greater than unity due to minority carrier injection at the collector are inadvertently produced by the known processes for making the collector connection. The result is an undesired negative resistance output characteristic for the units, caused by multiplication in the collector zone, which makes the device useless for some oscillator and amplifier applications.

Increasingly strict standards for transistor units press for improvements in this area. For example, in one series of PNP diffused base germanium transistors previous requirements dictated that minority carrier injection at the collector should not occur below a bias causing 10 milliamperes collector current while new standards specify that injection shall not occur below a bias causing 35 milliamperes collector current. A proportionate increase in the number of rejections due to minority carrier injection was experienced when known methods of making the collector connection were utilized.

Attempts to mitigate the difficulty followed courses directed by a theoretical understanding of solid state physics. One approach derives from the fact that a heavily doped region adjacent the collector connection inhibits the flow of minority carrier electrons from the contact. To this end, doping agents, such as P-type gallium or indium for PNP transistors, are diffused into the collector zone. While limiting injection to some extent, the technique does not satisfactorily solve the problem, as an intolerable drop in collector breakdown voltage occurs. Furthermore, the additional diffusion step imposes requirements on the process which are burdensome from both technical and economic viewpoints.

In another tack, it is attempted to limit the lifetime of minority carriers in the area adjacent the collector contact. Materials such as aluminum which increase the rate of recombination of holes and electrons are evaporated onto the collector contact. While this technique also tends to accomplish the purpose theoretically predicted for it, new problems result from the higher bonding temperatures which then become necessary. Efforts to find a satisfactory method also led to varying diffusion parameters such as junction depth and sheet resistance but no correlation appeared between them and the injection problem.

It is an object of this invention to provide an ohmic, non-injecting, connection for a semiconductive body. It is also an object to provide a transistor with an alpha of less than unity that is not deleteriously affected by minority carrier injection. Another object of the invention is to remove the factors in transistor production which fortuitously cause alphas in excess of unity. Still another object is to provide a header assembly which will form a purely ohmic connection with a transistor and also an effective seal with a protecting can.

To these ends, the invention provides a coating of a first layer of copper and a second layer of gold on the base material which is bonded to the semiconductive body. The relative amounts by weight of the materials must be strictly maintained in ratios of approximately one to one or one to three of copper to gold in the respective layers of the coating.

Figure 2:
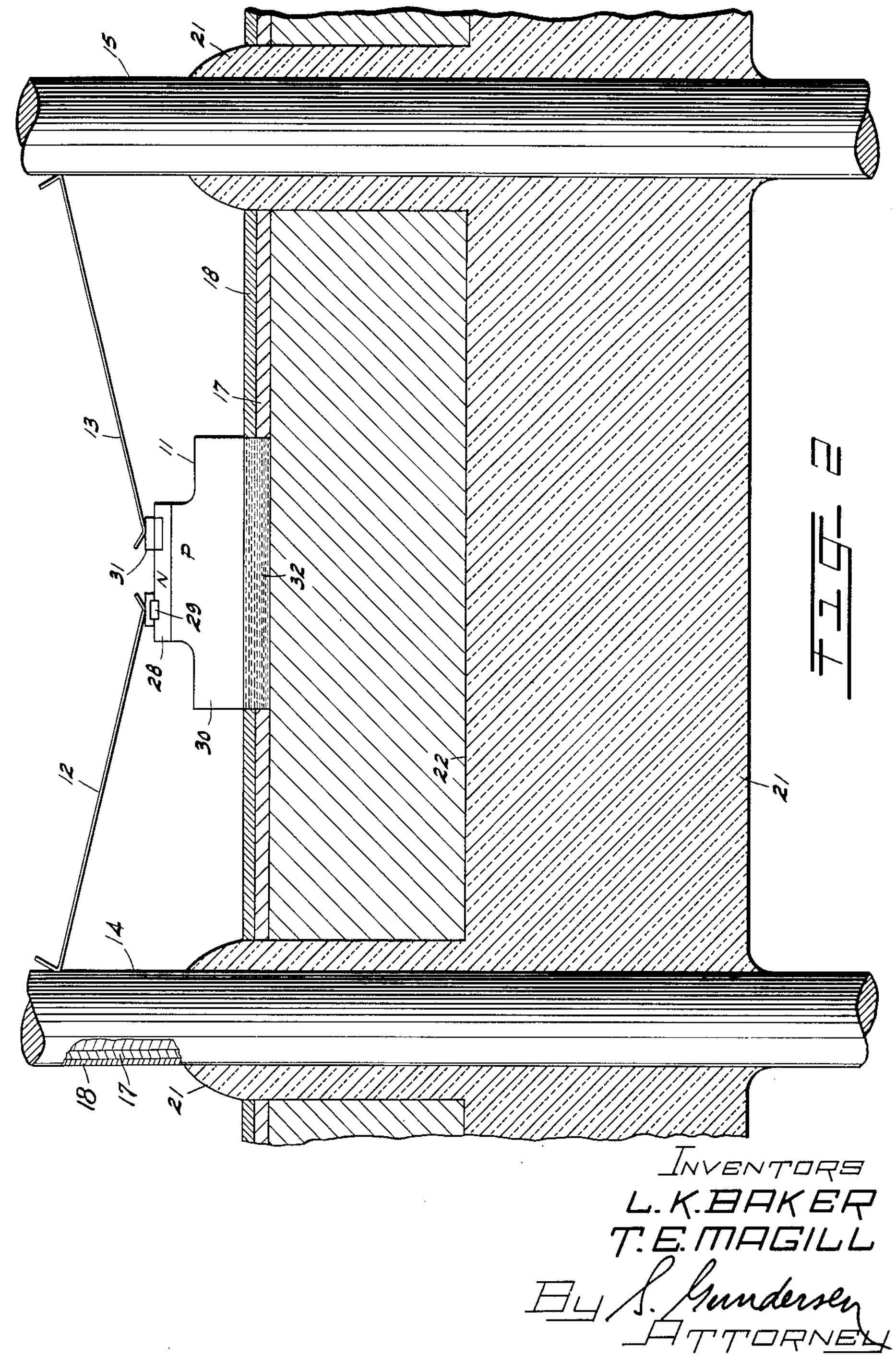
Figure 3:
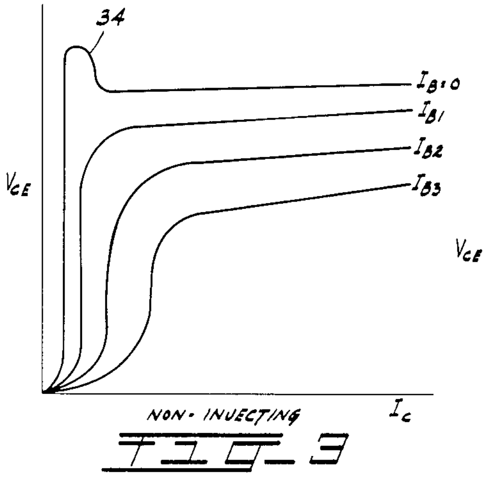
Figure 4:
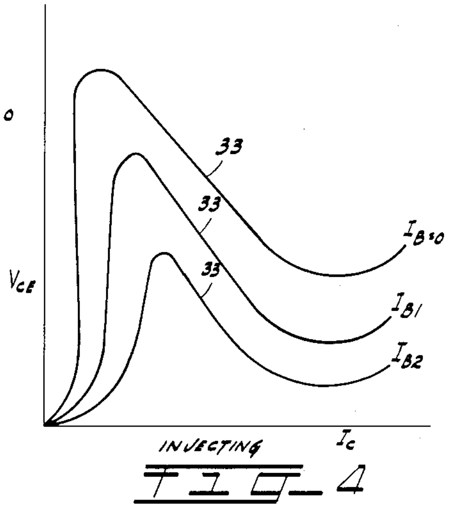
Figure 5:
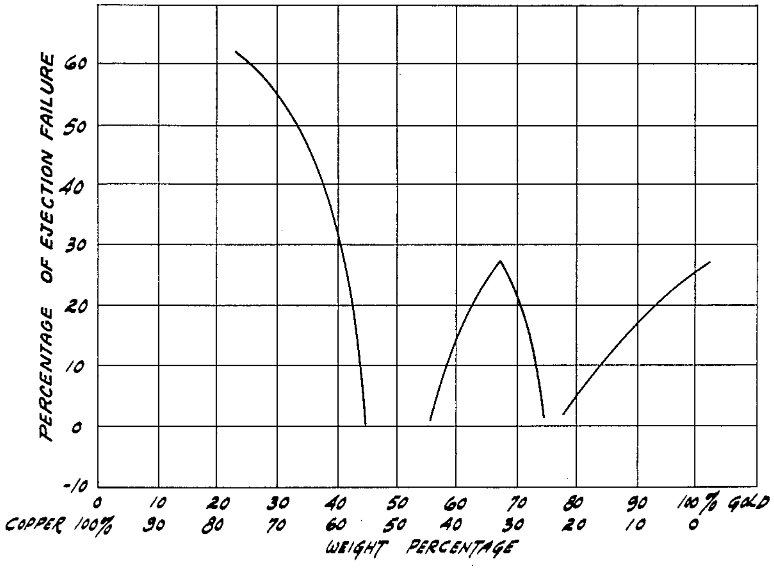

The invention will be understood from the following description in connection with the drawing in which:

FIG. 1 is a perspective exploded view of a transistor assembly which utilizes the invention, and FIG. 2 is an enlarged cross section taken along the plane of line 2—2 of FIG. 1, and FIG. 3 is a graph of an ohmic collector characteristic having non-injecting contacts according to the invention, and FIG. 4 is a graph of collector characteristics of an injecting collector contact not according to the invention, and FIG. 5 is a plot of percent injection failure versus composition of experimental samples with coating composition varied comparing the effects provided by the invention with effects resulting from deviations in the inventive ratios.

The transistor assembly of FIG. 1 is typical of PNP devices for use in low power oscillators and amplifiers operating in the HF and low VHF ranges. A PNP diffused germanium mesa transistor 11 has emitter 12 and base 13 connections respectively from the top of the mesa to header leads 14 and 15. The header, indicated generally as 16, utilizes Kovar as the principal material and is coated as shown in FIG. 2 first with a copper layer 17 then with a gold layer 18 in a manner which will be more fully discussed below. The header leads 14 and 15 for the emitter and base, respectively, and header lead 19 are centered in holes 20 through the platform portion of header 16 by means of insulating glass 21 which fills the underside of the header mesa as shown in FIG. 2. The glass 21 and the primary header material Kovar are selected to have compatible coefficients of heat expansion and to be otherwise compatible so that a leak-proof seal can be maintained between them under varying temperature conditions. All portions of the header 16 and header leads 14, 15, and 19 are coated with copper and gold layers 17 and 18 except surface 22 (FIG. 2) between the glass 21 and the Kovar. In FIG. 1, surface 22 is on the under or hidden side of the header 16.

Cap 23 is also made of Kovar but need not be plated as is the header 16. The cap 23 serves as protection for the transistor 11 and also serves to maintain an enclosure for an oxygen atmosphere within the finished assembly. The cap 23 is bonded to header 16 by means of the lower surface of flange 24 on the cap and the upper surface 25 of flange 26 on the header. Bonding of the flanges 24 and 26 accomplishes encapsulation of the assembly, after which the unit is evacuated and oxygen back filled through a copper tube 27, shown in its finished, pinched off, condition.

As is seen more clearly in FIG. 2, which is a section taken through plane 2—2 of FIG. 1, the transistor body 11 consists of an antimony diffused base zone 28 N-type conductivity, an alloy aluminum emitter zone 29 of P-type conductivity and a collector region 30 of P-type conductivity. A gold-silver strip 31 provides an alloy surface for the base contact 13.

FIG. 2 shows the relative dimensions of the parts in exaggerated and disproportionate scale for purposes of illustration. The collector connection is made by bonding the transistor 11 to the header at the lower surface of the collector region 30. A copper-gold-germanium ternary alloy region 32 is formed by raising the temperature of the interface to approximately 350° C. It has been determined that when the ratio by weight of copper to gold in the copper 17 and gold 18 layers is maintained according to this invention in the approximate ratio of one to one or one to three that the resulting collector contact is purely ohmic and that the injection of minority carriers from the contact region into the collector zone 30 is greatly reduced.

The critical nature of the ratios of copper to gold on the header coating is illustrated by the graphs of FIGS. 3 through 5. The plot of FIG. 5 shows the different percent injection for various amounts of copper and gold. It is seen from FIG. 5 that the percent of injection failure increases markedly as one deviates from these ratios. It is also seen that the beneficial effect does not extend to the region between the ratios, but that the regions are distinct. Assuming that an injection failure of 10 percent can be tolerated, it is seen when the ratio is approximately one to one the limits of the relative amounts by weight of the gold layer is from 42 to 58 percent with the remainder being of copper. The sum of gold and copper atoms makes up 100 percent of the coating and the germanium content in the ternary component is not considered at all. In other words, the composition of the gold and copper layers on the header prior to the bonding of the transistor is determinative of the eventual collector contact characteristic.

Similarly, with the 10 percent injection failure being again assumed permissible, it is seen from FIG. 5 that for the approximate one to three ratio mentioned above the limits are from 72 to 80 percent by weight of gold and the remainder copper.

The plots of FIG. 3 and 4 show the common emitter output characteristics respectively of good and bad units for a variety of base current ($I_B$) drive. The slopes of FIG. 3 show the collector resistances at different collector voltages with a constant collector bias voltage in a transistor formed according to the invention. As a result of the purely ohmic non-injecting character of the contact, the slopes are seen to be entirely positive (with the exception of portion 34 for $I_B=0$ which is typical of the $I_B=0$ curve). In contrast the analogous plot of FIG. 4 for typical transistor produced with a plating ratio outside of the critical range indicated above is seen to have the unsatisfactory negative resistance regions 33.

While the invention has been described in connection with a PNP germanium transistor, the inventive principle is applicable generally to the formation of ohmic, non-injecting contacts to germanium material. That is, the non-injecting contact of the invention may be used on diode as well as transistor or other semiconductive structures. Due to the extreme small physical size of the units on which the invention has been practiced, it is difficult to determine the precise metallurgical nature of the alloy of the bond. The alloy formed is very likely ternary and possibly of a superlattice type. It is pointed out, however, that an understanding of the precise composition of the alloy is not necessary to the practice of the invention and that the controlling influences for producing a non-injecting contact are fully set out herein, to wit, a contact material coated with copper and gold in the critical ratios described. Indications are that the advantageous effect is a function peculiarly of the copper-gold ratio. The advantages of the invention would accrue, therefor, to semiconductive materials other than germanium. Consequently, it is to be understood that the simply illustrative description of the application does not limit the extend of the invention. Other arrangements may be readily devised by those skilled in the art which will embody the principles of the invention and fall within its spirit and scope.

What is claimed is:

1. An ohmic connection between a header and a semiconductive body comprising a ternary alloy interface which includes a portion of the semiconductive body, and approximately equal parts by weight of gold and copper.

2. An ohmic connection between a header and a semiconductive body comprising a ternary alloy interface which includes a portion of the semiconductive body, and a certain quantity by weight of copper and approximately three times the quantity by weight of gold.

3. An ohmic connection as in claim 1 wherein the material of the semiconductive body is germanium.

4. An ohmic connection as in claim 2 wherein the material of the semiconductive body is germanium.

References Cited by the Examiner

UNITED STATES PATENTS

| | | | |
|---|---|---|---|
| 2,670,441 | 2/54 | McKay | 317—235 |
| 2,796,563 | 6/57 | Ebers et al. | 317—235 |
| 2,813,326 | 11/57 | Leibowitz | 29—25.3 |
| 2,836,878 | 6/58 | Shepard | 29—25.3 |
| 2,837,703 | 6/58 | Lidow | 317—234 |
| 2,863,105 | 12/58 | Ross | 317—234 |
| 2,957,112 | 10/60 | Sils | 317—234 |
| 3,028,529 | 4/62 | Belmont et al. | 317—234 |
| 3,063,129 | 11/62 | Thomas | 29—25.3 |
| 3,074,145 | 1/63 | Rowe | 29—25.3 |

OTHER REFERENCES

Darken and Gurry: Physical Chemistry of Metals, McGraw-Hill, 1953, page 94.

DAVID J. GALVIN, *Primary Examiner.*

SAMUEL BERNSTEIN, JOHN W. HUCKERT, JAMES D. KALLAM, *Examiners.*